(12) United States Patent
Annamalai et al.

(10) Patent No.: US 10,017,413 B2
(45) Date of Patent: Jul. 10, 2018

(54) DOPED SILICA-TITANIA GLASS HAVING LOW EXPANSIVITY AND METHODS OF MAKING THE SAME

(71) Applicant: CORNING INCORPORATED, Corning, NY (US)

(72) Inventors: Sezhian Annamalai, Painted Post, NY (US); Carlos Alberto Duran, Ottawa (CA); Kenneth Edward Hrdina, Horseheads, NY (US); Lisa Anne Moore, Corning, NY (US)

(73) Assignee: Corning Incorporated, Corning, NY (US)

( * ) Notice: Subject to any disclaimer, the term of this patent is extended or adjusted under 35 U.S.C. 154(b) by 41 days.

(21) Appl. No.: 14/950,374

(22) Filed: Nov. 24, 2015

(65) Prior Publication Data
US 2016/0145147 A1    May 26, 2016

Related U.S. Application Data

(60) Provisional application No. 62/084,829, filed on Nov. 26, 2014.

(51) Int. Cl.
| | |
|---|---|
| *C03C 3/06* | (2006.01) |
| *C03C 3/112* | (2006.01) |
| *C03C 3/089* | (2006.01) |
| *G03F 1/22* | (2012.01) |
| *C03B 25/02* | (2006.01) |
| *C03B 19/02* | (2006.01) |
| *C03C 3/115* | (2006.01) |
| *C03C 21/00* | (2006.01) |
| *C03C 23/00* | (2006.01) |
| *C03B 5/225* | (2006.01) |
| *C03B 25/00* | (2006.01) |

(52) U.S. Cl.
CPC ............. *C03C 3/112* (2013.01); *C03B 5/225* (2013.01); *C03B 19/02* (2013.01); *C03B 25/00* (2013.01); *C03B 25/02* (2013.01); *C03C 3/06* (2013.01); *C03C 3/089* (2013.01); *C03C 3/115* (2013.01); *C03C 21/007* (2013.01); *C03C 23/007* (2013.01); *G03F 1/22* (2013.01); *C03B 2201/10* (2013.01); *C03B 2201/12* (2013.01); *C03B 2201/14* (2013.01); *C03B 2201/42* (2013.01); *C03C 2201/10* (2013.01); *C03C 2201/12* (2013.01); *C03C 2201/14* (2013.01); *C03C 2201/23* (2013.01); *C03C 2201/30* (2013.01); *C03C 2201/42* (2013.01); *C03C 2203/10* (2013.01); *C03C 2203/54* (2013.01)

(58) Field of Classification Search
CPC ................................................. C03C 2201/42
USPC ......................................................... 501/54
See application file for complete search history.

(56) References Cited

U.S. PATENT DOCUMENTS

| | | | |
|---|---|---|---|
| 3,390,855 A | 7/1968 | Solin | |
| 3,673,049 A | 6/1972 | Giffen et al. | |
| 3,690,855 A | 9/1972 | Schultz | |
| 3,785,722 A * | 1/1974 | Schultz | C03C 3/06 |
| | | | 252/588 |
| 3,801,294 A | 4/1974 | Schultz et al. | |
| 3,806,570 A | 4/1974 | Flamenbaum et al. | |
| 4,337,295 A | 6/1982 | Rittler | |
| 4,597,786 A * | 7/1986 | Nakai | C01G 1/06 |
| | | | 501/30 |
| 4,680,048 A | 7/1987 | Motoki et al. | |
| 4,961,767 A | 10/1990 | Schermerhorn et al. | |
| 5,063,003 A | 11/1991 | Gonzalez-Oliver | |
| 5,175,199 A | 12/1992 | Asano et al. | |
| 6,032,487 A | 3/2000 | Kinoshita | |
| 6,209,357 B1 | 4/2001 | Bhandarkar et al. | |
| 6,442,977 B1 | 9/2002 | Bhandarkar et al. | |
| 6,832,493 B2 | 12/2004 | Bowden et al. | |
| 6,988,377 B2 * | 1/2006 | Bernas | C03B 19/06 |
| | | | 65/144 |
| 7,053,017 B2 | 5/2006 | Hrdina et al. | |
| 7,081,290 B2 | 7/2006 | Takahashi et al. | |
| 7,084,084 B2 * | 8/2006 | Arai | C03C 3/085 |
| | | | 422/240 |
| 7,155,936 B2 | 1/2007 | Dawes et al. | |
| 7,294,595 B2 * | 11/2007 | Iwahashi | C03B 19/1415 |
| | | | 219/553 |
| 7,429,546 B2 | 9/2008 | Iwahashi et al. | |
| RE40,586 E | 11/2008 | Hrdina et al. | |
| 7,538,052 B2 | 5/2009 | Iwahashi et al. | |
| 7,585,598 B2 | 9/2009 | Maida et al. | |
| RE41,220 E | 4/2010 | Davis Jr. et al. | |

(Continued)

FOREIGN PATENT DOCUMENTS

| | | | | |
|---|---|---|---|---|
| BE | 682846 A | * | 12/1966 | ............. C03C 3/078 |
| BE | 682846 A | | 12/1966 | |
| EP | 535388 A1 | | 4/1993 | |
| EP | 1484178 A1 | | 12/2004 | |
| JP | 4002625 A | | 1/1992 | |
| JP | 5058649 A | | 3/1993 | |
| WO | 2009084296 A1 | | 7/2009 | |
| WO | 2009116690 A1 | | 9/2009 | |

OTHER PUBLICATIONS

PCT International Searching Authority; International Search Report and Written Opinion; Application No. PCT/US2015/062298; International Filing Date Nov. 24, 2015; dated Apr. 20, 2016; pp. 1-11.

*Primary Examiner* — Noah S Wiese

(74) *Attorney, Agent, or Firm* — John P. Ciccarelli

(57) ABSTRACT

A method of forming a doped silica-titania glass is provided. The method includes blending batch materials comprising silica, titania, and at least one dopant. The method also includes heating the batch materials to form a glass melt. The method further includes consolidating the glass melt to form a glass article, and annealing the glass article.

11 Claims, No Drawings

(56) References Cited

U.S. PATENT DOCUMENTS

| | | | |
|---|---|---|---|
| 7,935,648 B2 * | 5/2011 | Maida | B82Y 10/00 |
| | | | 501/54 |
| 7,981,824 B2 | 7/2011 | Englisch et al. | |
| 7,989,378 B2 * | 8/2011 | Koike | C03B 19/1453 |
| | | | 501/54 |
| 7,998,892 B2 | 8/2011 | Koike et al. | |
| 8,012,653 B2 | 9/2011 | Koike et al. | |
| 8,034,731 B2 | 10/2011 | Koike et al. | |
| 8,093,165 B2 | 1/2012 | Koike et al. | |
| 8,329,604 B2 | 12/2012 | Iwahashi et al. | |
| 8,541,325 B2 | 9/2013 | Duran et al. | |
| 8,901,019 B2 | 12/2014 | Annamalai et al. | |
| 8,987,155 B2 | 3/2015 | Annamalai et al. | |
| 2002/0059810 A1 | 5/2002 | Borrelli et al. | |
| 2002/0108399 A1 | 8/2002 | Bhandarkar et al. | |
| 2002/0157421 A1 | 10/2002 | Ackerman et al. | |
| 2004/0045318 A1 | 3/2004 | Hrdina et al. | |
| 2004/0250573 A1 | 12/2004 | Hack et al. | |
| 2005/0153824 A1 | 7/2005 | Alkemper et al. | |
| 2005/0245382 A1 | 11/2005 | Iwahashi et al. | |
| 2006/0179879 A1 * | 8/2006 | Ellison | C03B 19/1415 |
| | | | 65/17.4 |
| 2007/0042893 A1 | 2/2007 | Koike et al. | |
| 2007/0207911 A1 | 9/2007 | Koike et al. | |
| 2007/0293388 A1 * | 12/2007 | Zuyev | C03C 1/02 |
| | | | 501/54 |
| 2008/0004169 A1 | 1/2008 | Ellison | |
| 2009/0143213 A1 | 6/2009 | Hrdina et al. | |
| 2010/0179047 A1 | 7/2010 | Koike et al. | |
| 2011/0028299 A1 | 2/2011 | Saitou et al. | |
| 2011/0043787 A1 | 2/2011 | Duran | |
| 2011/0048075 A1 | 3/2011 | Duran et al. | |
| 2011/0207593 A1 | 8/2011 | Duran et al. | |
| 2012/0121857 A1 | 5/2012 | Koike et al. | |
| 2012/0149543 A1 | 6/2012 | Koike et al. | |
| 2012/0238434 A1 * | 9/2012 | Koike | C03B 19/1453 |
| | | | 501/54 |
| 2012/0264584 A1 | 10/2012 | Miyasaka et al. | |
| 2013/0047669 A1 | 2/2013 | Annamalai | |
| 2013/0052391 A1 | 2/2013 | Annamalai | |
| 2013/0116108 A1 * | 5/2013 | Cassingham | C03C 1/02 |
| | | | 501/54 |
| 2015/0259239 A1 | 9/2015 | Annamalai et al. | |

* cited by examiner

DOPED SILICA-TITANIA GLASS HAVING LOW EXPANSIVITY AND METHODS OF MAKING THE SAME

This application claims the benefit of priority to U.S. Provisional Application No. 62/084,829 filed on Nov. 26, 2014 the content of which is incorporated herein by reference in its entirety.

FIELD

The present disclosure relates generally to doped silica-titania glass and methods for making the glass. More particularly, the present disclosure relates to methods of making doped silica-titania glass using batch melting techniques.

BACKGROUND

Optics, particularly reflective optics, is an important part of elements employed in Extreme Ultra-Violet (EUV) lithography. These elements are used with extreme ultraviolet radiation to illuminate, project, and reduce pattern images that are utilized to form integrated circuit patterns. The use of extreme ultraviolet radiation is beneficial in that smaller integrated circuit features can be achieved; however, the manipulation of the radiation in this wavelength range raises challenges.

In these and similar applications, low thermal expansion glass, such as silica-titania glass, is currently being used for making projection optics. In contrast to other materials, low thermal expansion glass provides improved polishability, improved coefficient of thermal expansion (CTE) control, and improved dimensional stability. However, as the development of these and similar applications proceeds, the demand for improved material characteristics grows.

Ultra-low expansion (ULE) glass has conventionally been made using laydown processes, where the glass is formed in layer deposits. One limitation of ULE glass made in accordance with a laydown process is that the resulting glass contains striae. Striae are compositional inhomogeneities which adversely affect optical transmission in elements made from the glass. Striae result in alternating thin layers of different CTE and therefore alternating planes of compression and tension between the layers. Striae in ULE glass are evident in the direction parallel with the top and bottom of the glass. For example, in silica-titania glass, the striae may include variations in titania composition of generally more than about 0.10 wt. % as compared to the local average titania level.

In some cases, striae have been found to impact surface finish at an angstrom root mean square (rms) level in reflective optic elements, which can adversely affect the polishability of the glass. Polishing glass having striae results in unequal material removal and unacceptable surface roughness which can present problems for stringent applications such as for EUV lithography elements. For example, it may create a mid-frequency surface structure that may cause image degradation in mirrors used in the projection systems for EUV lithography.

Additionally, in contrast with other glass forming methods such as batch melting, laydown processes involve multiple time consuming steps and a greater amount of material. As such, laydown processes are also more costly than other glass forming methods. However, because of the high viscosity and high slope of CTE versus temperature of the glass, it has previously been unfeasible to form ULE glass using conventional batch melting techniques.

SUMMARY

According to an embodiment of the present disclosure, a method of forming a doped silica-titania glass is provided. The method includes blending batch materials comprising silica, titania, and at least one dopant. The method also includes heating the batch materials to form a glass melt. The method further includes consolidating the glass melt to form a glass article, and annealing the glass article.

According to another embodiment of the present disclosure, a doped silica-titania glass formed by batch melting is provided. The glass includes between about 75 wt. % and about 91 wt. % silica, between about 9.0 wt % and about 17 wt. % titania, and between about 0.001 wt. % and about 10 wt. % of at least one dopant.

According to another embodiment of the present disclosure, an optical element for photolithography is provided. The optical element includes a doped silica-titania glass formed by batch melting. The glass includes between about 75 wt. % and about 91 wt. % silica, between about 9.0 wt % and about 17 wt. % titania, and between about 0.001 wt. % and about 10 wt. % of at least one dopant.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to the present embodiment(s), an example(s) of which is/are illustrated in the accompanying drawings. Whenever possible, the same reference numerals will be used throughout the drawings to refer to the same or like parts.

The singular forms "a," "an" and "the" include plural referents unless the context clearly dictates otherwise. The endpoints of all ranges reciting the same characteristic are independently combinable and inclusive of the recited endpoint. All references are incorporated herein by reference.

Doped silica-titania glass and methods of forming such glass using batch melting techniques are provided herein. The doped silica-titania glass has lower viscosity, lower CTE and a lower slope of CTE versus temperature, as compared to conventional doped silica-titania glass. The doped silica-titania glass is highly polishable and includes uniformity in fictive temperature and high spatial uniformity of thermal expansion properties through the thickness of the glass. In contrast to conventional doped silica-titania glass, the properties of the glass disclosed herein enable formation of the glass using batch melting techniques.

The doped silica-titania glass may be used as substrate materials for mirrors, other optics and photomasks in EUV lithography processing systems and in other applications where increased thermal and dimensional stability may be beneficial. In addition, the doped silica-titania glass may be formed in smaller volumes and used as an insert in a critical zone of a mirror blank for projection optics. Mirrors used in projection optics can have a diameter in the range of about 10 cm to about 60 cm, and may become even larger in the future. The overall cost of the mirror can be reduced by identifying the critical zone of the mirror substrate and limiting use of glass, such as the doped silica-titania glass disclosed herein, to the critical zone of the substrate. The balance of the substrate may be formed from conventional titania-silica glass. The use of inserts in the critical zone of EUV lithography elements is disclosed in commonly owned U.S. Patent Publication Nos. 2013/0047669 A1 and 2013/0052391 A1, the specifications of which are incorporated by reference in their entirety.

The method of forming doped silica-titania glass may include mixing batch materials. As used herein, the term "batch materials", and variations thereof, denote a mixture of glass precursor components which, upon melting, react and/or combine to form a glass. The batch materials may be prepared and/or mixed by any known method for combining glass precursor materials. For example, the batch materials may include a dry or substantially dry mixture of glass precursor particles, e.g., without any solvent or liquid. In other embodiments, the batch materials may be in the form of a slurry, for example, a mixture of glass precursor particles in the presence of a liquid. A liquid may promote more intimate contact of the glass precursor particles and may advantageously promote mixing of the glass precursor particles. Where the batch materials are mixed in the form of a slurry, the method may also include drying the mixture prior to melting the batch materials. The mixture may be dried by any known method such as by drying in a furnace, or by spray drying.

The batch materials may include glass precursor materials such as, but not limited to, silica, titania, additives containing chlorine or fluorine, and various additional oxides such as, but not limited to, oxides containing boron, niobium, tantalum, aluminum, manganese, lithium, sodium, potassium, calcium, arsenic, antimony, tin, copper, zirconium, germanium and magnesium. Some of the glass precursor materials may be the by-product of high purity fused silica glass making processes which may include, but are not limited to, conventional chemical vapor deposition (CVD) processes, such as outside vapor deposition (OVD) and vapor axial deposition (VAD) processes. Some of the glass precursor materials may also be collected from soot generation systems.

The glass precursor materials may be of any particle size; however, it is preferred that glass precursor materials having fine particle size are used to form the doped silica-titania glass disclosed herein. As used herein, the term "fine particle size" is meant to define a particle size of less than about 250 μm. For example, the silica particles may have a size of between about 0.05 μm and about 0.25 μm and the titania particles may have a size of between about 0.01 μm and about 0.10 μm. Additionally, the silica particles and the titania particles may have a particulate surface area of greater than about 10 m$^2$/g, or greater than about 15 m$^2$/g, or greater than about 20 m$^2$/g, or even greater than about 50 m$^2$/g.

According to embodiments of the present disclosure, the glass precursor materials may include up to about 91 wt. % silica, for example, between about 75 wt. % and about 91 wt. %. In addition to silica, the glass precursor materials may include between about 9.0 wt. % and about 17 wt. % titania, or between about 9 wt. % and about 14 wt. %. titania. The glass precursor materials may also include between about 0.001 wt. % and about 10 wt. % of one or more additional oxides, or between about 0.10 wt. % and about 8.0 wt. % of one or more additional oxides. The batch materials may have a binary composition of silica and titania or may have a ternary composition of silica, titania and an additional oxide. The glass precursor materials may also have a composition of silica, titania and a plurality of additional oxides.

The method of forming doped silica-titania glass may also include melting the batch materials to form a glass melt. The batch materials can be melted according to any method known in the art, including the methods discussed herein. For example, the batch materials may be added to a melting vessel and heated to a temperature of between about 1100° C. and about 1700° C., such as between about 1200° C. and about 1650° C., or between about 1250° C. and about 1600° C., or even between about 1300° C. and about 1500° C. The batch materials may remain in the melting vessel for a period of between about several minutes and about several hours, depending on various variables, such as the operating temperature and the batch size. For example, batch materials may remain in the melting vessel for a period of between about 30 minutes and about 8.0 hours, or between about 1.0 hour and about 6.0 hours, or between about 2.0 hours and about 5.0 hours, or even between about 3.0 hours and about 4.0 hours.

Subsequent to melting the batch materials, the glass melt may be subjected to additional processing steps. Such additional processing steps may include, but are not limited to, fining to remove gas bubbles from the glass melt, and stirring to homogenize the glass melt. A fining agent may be introduced into the glass melt, such as by addition to the batch materials. The fining agent may be, for example, a multivalent oxide that is reduced at high temperatures, and is oxidized at low temperatures. For example, the fining agent may be, but is not limited to, arsenic pentoxide ($As_2O_5$), antimony oxide ($Sb_2O_5$), tin oxide ($SnO_2$), iron (III) oxide ($Fe_2O_3$) and cerium (IV) oxide ($CeO_2$). The fining agent may also be a mixture of at least one of the above-mentioned oxides and a halide-containing compound.

Fining may include heating the glass melt to a temperature above the melting temperature. The fining temperature may depend on the glass composition and on the melting temperature, but is preferably at least about 1500° C.; more preferably at least about 1600° C., and even more preferably at least about 1650° C. The increase in temperature of the glass melt reduces viscosity, making it easier for gas bubbles in the glass melt to rise to the surface. The increase in temperature of the glass melt also enables release of oxygen into the glass melt by the fining agent, which in turn assists in the removal of gas bubbles. Generally, oxygen released by the fining agent may diffuse into gas bubbles formed during the melting process. The buoyancy of the gas bubbles is thereby increased, and the gas bubbles rise to the surface of the glass where the gas is released out of the glass melt. Once the glass melt has been fined, it may be cooled and stirred to homogenize the glass melt.

The method of forming doped silica-titania glass may also include consolidating the glass melt to form a glass article. Consolidating the glass melt may include heating the glass melt to a temperature of greater than about 1500° C., for example, between about 1500° C. and about 1800° C., such as between about 1550° C. and about 1750° C., or between about 1600° C. and about 1700° C. The glass melt may be consolidated under vacuum in an atmosphere including, but not limited to, argon, nitrogen and helium. Subsequent to consolidation, the method may further include degassing the glass article by placing the glass article in a holding oven to allow gas to diffuse out of the glass article.

Alternatively, consolidating the glass melt may include exposing the glass melt to a steam-containing atmosphere. The steam-containing atmosphere may include only steam or steam in combination with other gases such as, but not limited to, helium, oxygen, and combinations thereof. When present, the partial pressure of oxygen in the steam-containing atmosphere may be less than about 0.20 atm, or less than about 0.10 atm, or less than about 0.05 atm, or even less than about 0.02 atm. Maintaining a low concentration of oxygen may inhibit formation of voids in the glass article caused by the entrapment of gas during the consolidation process.

When the steam-containing atmosphere includes only steam, the pressure of steam may be up to about 10 atm, such as a pressure of between about 0.10 atm and about 10 atm, or between about 0.50 atm and about 5.0 atm, or between about 0.70 atm and about 2.5 atm, or even between about 0.90 atm and about 1.3 atm. When the steam-containing atmosphere includes steam in combination with other gases, the total pressure of the steam-containing atmosphere may be up to about 10 atm, and the partial pressure of steam may between about 0.1 atm and about 9.5 atm, or between about 1.5 atm and about 5.0 atm, or between about 0.70 atm and about 2.5 atm, or even between about 0.90 and about 1.3 atm. Also, when the steam-containing atmosphere includes steam in combination with other gases, the steam-containing atmosphere may include at least about 10 vol % steam, or at least about 25 vol % steam, or at least about 50 vol % steam, or at least about 75 vol % steam, or at least about 90 vol % steam, or even between about 90 vol % and about 99 vol % steam.

The use of a steam-containing atmosphere during consolidation may provide several benefits. The use of steam may allow for the utilization of atmospheric pressure furnaces during consolidation, and may facilitate consolidating the glass melt without using helium gas or using vacuum consolidation furnaces, each of which can add to the overall costs of forming a glass article. Atmospheric pressure furnaces are capable of tolerating the steam-containing atmosphere, and no special enclosures are required. Exposure to steam also promotes doping of the glass melt with hydroxyl groups. Hydroxyl groups may reduce viscosity, which reduces fictive temperature, and, in turn, reduces the slope of CTE versus temperature. Steam also promotes a partial pressure of oxygen ($P_{O2}$) that minimizes formation of trivalent titanium ($Ti^{3+}$). The presence of $Ti^{3+}$ reduces transmission in the glass article and is believed to increase CTE.

The method of forming doped silica-titania glass may also include heating the glass article to form a glass article substantially free of crystalline material. As used herein, the term "substantially free of crystalline material" is meant to describe a glass article having less than about 1.0% crystalline material. Heating the glass article may include heating the glass article to a temperature of greater than about 1500° C., for example, between about 1500° C. and about 1800° C., such as between about 1600° C. and about 1790° C., or between about 1650° C. and about 1750° C. The glass article may be heated in an atmosphere including, but not limited to, argon, nitrogen and helium. The glass article may be heated for a first period over a first temperature range in an atmosphere including one of argon, nitrogen and helium and then further heated for a second period over a second temperature range in an atmosphere including another of argon, nitrogen and helium. For example, where the glass article is heated to a temperature of about 1700° C., the glass article may be heated from about room temperature to about 1600° C. in an atmosphere of helium. Flow of helium may be stopped once the temperature reaches about 1600° C., and a flow of argon may be introduced while the glass article is heated from about 1600° C. to about 1700° C. By heating the glass article, any crystalline material remaining in the glass article after consolidation may be melted, and a glass article having greater silica-titania homogeneity may be formed.

The method of forming doped silica-titania glass may also include doping the glass melt which may include contacting the glass melt with a dopant precursor gas. The dopant precursor gas may include, but is not limited to, a fluorine precursor gas. The fluorine precursor gas may be, but is not limited to, $F_2$, $C_2F_6$, $CF_4$, $SF_6$ and $SiF_4$, and combinations thereof. The dopant precursor gas may be mixed with a carrier gas, such as, but not limited to inert gases such as air or nitrogen. The carrier gas may also be an oxygen-containing gas. Where the dopant precursor gas is a fluorine precursor gas, an oxygen-containing carrier gas may serve to convert the non-fluorine portion of the fluorine precursor gas to a volatile species, for example $CO_2$, SiO or $SO_2$, and remove the volatile species with the carrier gas while doping the glass melt. Oxygen from the oxygen-containing carrier gas may also diffuse into the glass melt and react with trivalent titanium ($Ti^{3+}$) to lower oxidation states of titanium and to convert such titanium to tetravalent titanium ($Ti^{4+}$).

The method of forming doped silica-titania glass may also include annealing the glass article. Following consolidation, the glass article may be cooled to a holding temperature of less than about 1000° C., for example, between about 600° C. and about 1000° C., for a holding period of at least about 30 minutes, for example, between about 30 minutes and about 2.0 hours. After completion of the holding period, the temperature may be decreased to a predetermined temperature, between about 700° C. and about 850° C., at a rate of less than about 10° C. per hour. For example, the rate may be between about 0.10° C. per hour and about 10° C. per hour, or between about 0.10° C. per hour and about 5.0° C. per hour, or even between about 0.10° C. per hour and about 1.0° C. per hour. Once the predetermined temperature is reached, heat from a heat source may be removed, and the temperature may be allowed to cool to ambient temperature. Annealing the glass article as disclosed herein provides improved uniformity in fictive temperature and achieves high spatial uniformity of thermal expansion properties.

The glass article may be further processed to form optical elements. Once the glass article has been cooled to ambient temperature, the glass article may be cut, cored or otherwise processed into shapes that are suitable for making optical elements. Such processing, in addition to cutting or coring, may include etching, additional thermal treatments, grinding, polishing, applying selected metals to form a mirror, and such additional processing as may be necessary to form the desired optical element.

The doped silica-titania glass disclosed herein may have between about 9.0 wt. % and about 17 wt. % titania, or between about 9 wt. % and about 14 wt. %. titania. As compared to conventional ULE glass which commonly has between about 7.0 wt. % and about 9.0 wt. %. titania, the doped silica-titania glass disclosed herein may have a greater titania concentration. The doped silica-titania glass may also include at least one dopant. The at least one dopant may be, but is not limited to, fluorine and oxides containing boron, niobium, tantalum, aluminum, manganese, lithium, sodium, potassium, calcium, arsenic, antimony, tin, copper, zirconium, germanium and magnesium. The at least one dopant may also be a hydroxyl group.

Where the dopant is a boron-containing oxide, the dopant concentration may be selected to provide low slope of CTE versus temperature and/or to provide low CTE. The doped silica-titania glass may include less than about 8.0 wt. % boron-containing oxide, for example, between about 0.50 wt. % and about 5.0 wt. % boron-containing oxide. Similarly, where the dopant is fluorine, the fluorine concentration may be selected to provide low slope of CTE versus temperature and/or to provide low CTE. The fluorine concentration may be less than about 2.0 wt. %, such as between about 0.001 wt. % and about 2.0 wt. % or between about 0.05 wt. % and about 1.5 wt. %. Where the dopant is a hydroxyl group, the hydroxyl concentration may be between about 0.001 wt. % and about 0.20 wt. %, or between about 0.01 wt. % and about 0.15 wt. %, or between 0.03 wt. % and about 0.15 wt. %, or even between about 0.06 wt. % and about 0.15 wt. %. Where the dopant is an oxide containing, niobium, tantalum, aluminum, manganese, lithium, sodium, potassium, calcium, arsenic, antimony, tin, copper, zirconium, germanium or magnesium, the concentration of oxides may be between about 0.001 wt. % and about 10 wt. %, or between about 0.10 wt. % and about 8.0 wt. %.

Adjustments in the concentrations of titania and of dopants in the doped silica-titania glass as disclosed herein provides control over the fictive temperature of the glass, as well as the zero crossover temperature(s). A zero crossover temperature is a temperature at which the CTE of the glass is zero. When a glass has a CTE of zero, it neither expands nor contracts when heated or cooled. The doped silica-titania glass disclosed herein has a first crossover temperature ($T_{ZC1}$) and a second crossover temperature ($T_{ZC2}$) within the typical operational temperature range for optical elements and photomasks in EUV lithography. For example, the $T_{ZC1}$ and $T_{ZC2}$ may be between about 10° C. and about 150° C., or between about 0° C. and about 100° C. The $T_{ZC1}$ and $T_{ZC2}$ may be between about 20° C. and about 80° C., or between about 20° C. and about 60° C., or even between about 10° C. and about 40° C.

The doped silica-titania glass as disclosed herein may have a CTE slope versus temperature of less than about 1 ppb/K$^2$. For example, the CTE slope versus temperature may be less than about 0.80 ppb/K$^2$, or even less than about 0.60 ppb/K$^2$. The CTE slope versus temperature may be, for example, about 0±2.0 ppb/K$^2$ throughout the temperature range from $T_{ZC1}$ to $T_{ZC2}$, or about 0±1.5 ppb/K$^2$ throughout the temperature range from $T_{ZC1}$ to $T_{ZC2}$, about 0±1.0 ppb/K$^2$ throughout the temperature range from $T_{ZC1}$ to $T_{ZC2}$, about 0±0.50 ppb/K$^2$ throughout the temperature range from $T_{ZC1}$ to $T_{ZC2}$, or even about 0±0.30 ppb/K$^2$ throughout the temperature range from $T_{ZC1}$ to $T_{ZC2}$.

The doped silica-titania glass as disclosed herein may have a peak CTE of the titania-silica glass between $T_{ZC1}$ and $T_{ZC2}$ of less than about 30 ppb/K. For example, the peak CTE may be less than about 20 ppb/K, or less than about 10 ppb/K, or less than about 5.0 ppb/K, or even less than about 3.0 ppb/K.

The doped silica-titania glass disclosed herein may also have high spatial uniformity through the thickness of the glass. The variation of titania concentration through the thickness of the doped silica-titania glass may be less than about 0.10 wt. %, and the glass may be uniform and substantially free of striae. Such uniformity renders the doped glass article polishable, which in turn facilitates processing of the doped glass article to form the optical elements disclosed herein. The doped silica-titania glass may also have little to no variation of zero crossover temperature through the thickness of the glass. For example, the variation of $T_{ZC1}$ and $T_{ZC2}$ from one part of the glass to another part of the glass may be less than about 5.0° C., less than about 3.0° C., or even less than about 1.0° C.

EXAMPLES

Embodiments of the present disclosure are further described below with respect to certain exemplary and specific embodiments thereof, which are illustrative only and not intended to be limiting.

Example 1

The batches of Table I were prepared with batch materials having fine particle size. The silica powder had a particle size of about 0.10 μm, the titania powder had a particle size of between about 0.02 μm and about 0.025 μm, and the boron-oxide powder had a particle size of about 250 μm. The batch materials were dry mixed in a shaker mixer such as a TURBULA® Shaker-Mixer (commercially available from Glenn Mills, Inc., Clifton, N.J.). After mixing, a slurry was formed by adding about 1.0 gram of water for every 3.0 grams of batch materials. The slurry was placed in a rolling container and rolled for about 12 hours. After rolling, the rolling container was vacuum degassed and the slurry was dried in a drying oven at a temperature of about 120° C. for about 12 hours. The resulting dried batch materials were crushed, placed in a platinum/rhodium crucible and purged in helium gas for about 12 hours. The crucibles containing the batch materials were placed in a furnace and heated in an atmosphere of helium at a temperature of about 1725° C. for about 2.0 hours to melt the batch materials. The flow of helium was discontinued and the crucibles were held at a temperature of about 1725° C. for about 12 hours. The crucibles were removed from the furnace and cooled to room temperature. The glass resulting from each of the batches were observed to be clear with no crystals detected in the glass.

TABLE I

|  | SiO$_2$ (wt. %) | SiO$_2$ (wt. %) | B$_2$O$_3$ (wt. %) |
| --- | --- | --- | --- |
| Batch 1 | 87.50 | 9.50 | 3.00 |
| Batch 2 | 85.00 | 10.50 | 4.50 |
| Batch 3 | 82.50 | 11.50 | 6.00 |

Example 2

In accordance with conventional batch melting techniques, the batch materials of Table II were prepared with batch materials having large particle size. The silica powder had a particle size of about 45 μm, the titania powder had a particle size of about 44 μm, and the boron-oxide powder had a particle size of about 250 μm. The batch materials were mixed and ground using a ball mill and placed in platinum/rhodium crucibles. The crucibles containing the batch materials were placed in a furnace and heated at a temperature of about 1650° C. for about 12.0 hours. The furnace temperature was then lowered to an annealing temperature of about 1000° C. The contents of the crucibles were examined for the formation of glass. Batches 4-6 did not melt to form glass. Batch 7 melted, but the resulting glass was observed to be opaque and inhomogeneous. The use of batch materials having large particle size was determined to be ineffective to form silica-titania glass in accordance with the present disclosure.

TABLE II

|         | $SiO_2$ (wt. %) | $SiO_2$ (wt. %) | $B_2O_3$ (wt. %) |
|---------|-----------------|-----------------|------------------|
| Batch 4 | 92.50           | 7.50            | 0.00             |
| Batch 5 | 87.50           | 9.50            | 3.00             |
| Batch 6 | 85.00           | 10.50           | 4.50             |
| Batch 7 | 82.50           | 11.50           | 6.00             |

Example 3

The batch of Table III was prepared with batch materials having fine particle size. The silica powder had a particle size of about 0.10 µm, the titania powder had a particle size of about 0.01 µm, and the boron-oxide powder had a particle size of about 250 µm. The batch materials were dry mixed in a shaker mixer. After mixing, the batch materials were placed in a platinum/rhodium crucible which were placed in a furnace and heated to a temperature of about 1725° C. for about 24 hours to melt the batch materials. The furnace temperature was then lowered to an annealing temperature of about 1000° C. The glass resulting from Batch 8 was observed to not be fully homogenous and to have titania crystals. While the dry mixing of the fine particle batch materials of Batch 8 resulted in an improved glass as compared to the large particle batch materials of Batches 4-7, it was determined that dry mixing alone was ineffective to form silica-titania glass that is substantially free of crystalline material.

TABLE III

|         | $SiO_2$ (wt. %) | $SiO_2$ (wt. %) | $B_2O_3$ (wt. %) |
|---------|-----------------|-----------------|------------------|
| Batch 8 | 85.00           | 10.50           | 4.50             |

Example 4

Batch 2 as formed in Example 1 was placed in a helium purged platinum box which was placed in a furnace. The batch materials were consolidated in the furnace according to the following schedule:
(1) Heat from room temperature to about 1050° C. at a rate of about 6.0° C. per minute;
(2) Hold at about 1050° C. for about 90 minutes;
(3) Heat from about 1050° C. to about 1535° C. at rate of about 4.0° C. per minute;
(4) Hold at about 1535° C. for about 30 minutes;
(5) Heat from about 1535° C. to about 1620° C. at a rate of about 12° C. per minute;
(6) Heat from about 1620° C. to about 1670° C. at a rate of about 9.5° C. per minute;
(7) Remove heat and allow furnace to cool to room temperature;
(8) Heat from room temperature to about 1620° C. under a flow of about 5.0 standard liters per minute (SLPM) helium;
(9) Heat from about 1620° C. to about 1670° C. under a flow of about 2.0 SLPM argon; and
(10) Hold at about 1670° C.

After consolidation, the thermal expansion properties of a portion of the glass were measured and the glass was determined to have a slope of CTE versus temperature of less than about 1.0 ppb/$K^2$ at least through the temperature range of about 20° C. to about 200° C.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of forming a doped silica-titania glass, the method comprising:
   blending batch materials comprising silica, titania, and at least one dopant, the silica and titania having fine particle size, and the at least one dopant being one of a material with fine particle size and a dopant precursor gas, wherein the batch materials comprise titania having a particle size of between about 0.01 µm and about 0.10 µm;
   heating the batch materials to form a glass melt;
   consolidating the glass melt to form a glass article; and
   annealing the glass article.

2. The method of claim 1, wherein the at least one dopant is selected from the group consisting of chlorine, fluorine, and oxides containing boron, niobium, tantalum, aluminum, manganese, lithium, sodium, potassium, calcium, arsenic, antimony, tin, copper, zirconium, germanium and magnesium, and combinations thereof.

3. The method of claim 1, wherein blending the batch materials comprises forming a slurry in the presence of a liquid.

4. The method of claim 1, wherein the at least one dopant comprises a dopant precursor gas, and wherein the dopant precursor gas is a fluorine precursor gas.

5. The method of claim 4, wherein the fluorine precursor is selected from the group consisting of $F_2$, $C_2F_6$, $CF_4$, $SF_6$, $SiF_4$ and combinations thereof.

6. The method of claim 1, further comprising heating the glass article to form a glass article substantially free of crystalline material.

7. The method of claim 1, comprising consolidating the glass melt under vacuum.

8. The method of claim 1, wherein consolidating the glass melt comprises exposing the glass melt to a steam-containing atmosphere.

9. The method of claim 1, wherein annealing the glass article comprises holding the glass article at a temperature between about 600° C. and about 1000° C.

10. The method of claim 1, wherein annealing the glass article comprises cooling the glass article at a rate of less than about 10° C. per hour.

11. The method of claim 1, wherein the batch materials comprise:
    between about 75 wt. % and about 91 wt. % silica;
    between about 9.0 wt % and about 17 wt. % titania; and
    between about 0.001 wt. % and about 10 wt. % of the at least one dopant.

* * * * *